(12) United States Patent
Duane et al.

(10) Patent No.: US 6,603,155 B2
(45) Date of Patent: Aug. 5, 2003

(54) OVERVOLTAGE PROTECTION DEVICE

(75) Inventors: Russell Duane, Wilton (IE); Jeremy Paul Smith, Wollaston (GB); Steven Wilton Byatt, Bromham (GB)

(73) Assignee: Power Innovations, Ltd., Bedford (GB)

(*) Notice: Subject to any disclaimer, the term of this patent is extended or adjusted under 35 U.S.C. 154(b) by 0 days.

(21) Appl. No.: 10/117,524

(22) Filed: Apr. 4, 2002

(65) Prior Publication Data

US 2002/0190324 A1 Dec. 19, 2002

(30) Foreign Application Priority Data

Apr. 7, 2001 (GB) .............................................. 0108792

(51) Int. Cl.[7] .............................................. H01L 29/74
(52) U.S. Cl. ........................ 257/173; 257/355; 257/360
(58) Field of Search ................. 257/173, 355, 257/360

(56) References Cited

U.S. PATENT DOCUMENTS 5,808,342 A * 9/1998 Chen et al.
5,889,293 A * 3/1999 Rutten et al.
6,407,901 B1 * 6/2002 Casey et al.

FOREIGN PATENT DOCUMENTS

EP  0700099  3/1996

* cited by examiner

*Primary Examiner*—Fetsum Abraham
(74) *Attorney, Agent, or Firm*—Klein, O'Neill & Singh, LLP

(57) ABSTRACT

A semiconductor device has a PN junction between first and second regions of the device in which in the intended operation of the device reverse breakdown of the junction occurs. The first region is of lower impurity concentration than the second region and a first buried region of the same conductivity type as and of higher impurity concentration than the first region is provided in the first region adjacent to the junction. A second buried region of the same conductivity type as and of higher impurity concentration than the first buried region is provided in the first buried region and one of the first and second buried regions is formed with a plurality of separate regions of small area arranged so that reverse breakdown of the junction preferentially occurs through the second buried region.

11 Claims, 4 Drawing Sheets

OVERVOLTAGE PROTECTION DEVICE

BACKGROUND OF THE INVENTION

1. Field of the Invention

The present invention relates to an overvoltage protection device.

2. Description of the Prior Art

There are in existence a wide range of semiconductor devices which are designed to protect telecommunications equipment from overvoltages which can occur on telephone lines as a result of, for example, lightening strikes and AC power surges. Many of these semiconductor devices are based on a four layer PNPN structure which is designed to switch quickly from a blocking state to a high conduction state when the voltage across the device exceeds a predetermined threshold level.

GB-A-2 113 907 describes a four layered diode (PNPN) semiconductor device which is usable as a transient suppressor because it switches from a high resistance condition to a low resistance condition when the current through it reaches a threshold value. The device has a thyristor type structure with a controlled holding current and an additional buried N-region through which reverse breakdown of the central junction of the structure takes place to control the initial avalanche breakover voltage.

This buried region is of the same conductivity type as the region in which it is formed and has a greater impurity concentration than that region. The effect of the buried region is to cause the reverse voltage breakdown through the central junction to take place through the buried region. This enables the breakdown voltage of the device to be controlled more accurately than is the case in a conventional four layer diode. Although it is not shown in GB-A-2 113 907, the outer layer which acts as the emitter has a number of perforations or dots through it where the material of the adjacent inner layer reaches the surface. The metal contact at the surface produces a resistive short circuit across the junction between the outer and inner layers serving to define the holding current of the device.

In the structure described above the avalanche occurs uniformly across the buried region. The resulting current forward biasses the anode-substrate junction. Similarly, the avalanche current flows via the shorting dots causing a resistive voltage drop thus forward biassing the base-cathode junction and causing the device to latch. Suitable choice of shorting geometry helps to avoid localised switching of the base-cathode junction.

Among the many important characteristics of an overvoltage protection device are the peak voltage before switching occurs, known as the breakover voltage $V_{BO}$, and the maximum voltage below which the device should be operated under normal conditions, known as the forward repetitive maximum voltage $V_{DRM}$. The difference between $V_{BO}$ and $V_{DRM}$ represents a reduction in the size of the safe voltage window for the equipment and therefore the ratio of $V_{BO}$ to $V_{DRM}$ should be as close to unity as is possible in order to maximise the operating window for the equipment being protected.

The ability to control the turn on characteristics of such a device not only improves the system protection which the device can provide but in certain applications can improve the power dissipation capability of the device.

BRIEF SUMMARY OF THE INVENTION

It is an object of the present invention to provide an improved semiconductor overvoltage protection device.

Accordingly, the present invention provides a semiconductor overvoltage protection device in the form of a four layer diode having: first and third layers of a first conductivity semiconductor material; second and fourth layers of a second conductivity type semiconductor material; a first buried region of the first conductivity type in the third layer adjacent to the junction between the second and third layers, the buried region having a greater impurity concentration than the third layer; and a second buried region of the same conductivity type as and of higher impurity concentration than said first buried region in said first buried region adjacent to said junction; wherein: said first layer is penetrated by a plurality of dots of said second layer extending through said first layer; one of said first and second buried regions is formed with a plurality of separate regions of small area arranged so that reverse breakdown of the junction preferentially occurs through said second buried region; and said dots do not overlie portions of said second buried region.

Advantageously, said second buried region is formed with said plurality of separate regions, said regions being laterally offset from said dots.

Advantageously, said first buried region is formed with said plurality of separate regions.

Advantageously, each said dot vertically overlies a respective region of said first buried region.

Advantageously, said second buried region terminates within said first buried region.

Advantageously, said second buried region extends into said first region.

Advantageously, the ratio of impurity concentration in said first and second buried regions is such that the breakdown voltage between said second layer and said first buried region exceeds the breakdown voltage between said second layer and said second buried region by no more than 5%.

Advantageously, one or more of said separate regions has a lateral dimension greater than that of the associated dot.

Advantageously, one or more of said separate regions has a lateral dimension the same as that of the associated dot.

BRIEF DESCRIPTION OF THE DRAWINGS

The present invention is further described hereinafter, with reference to the accompanying drawings, in which.

DETAILED DESCRIPTION

Figure 1:
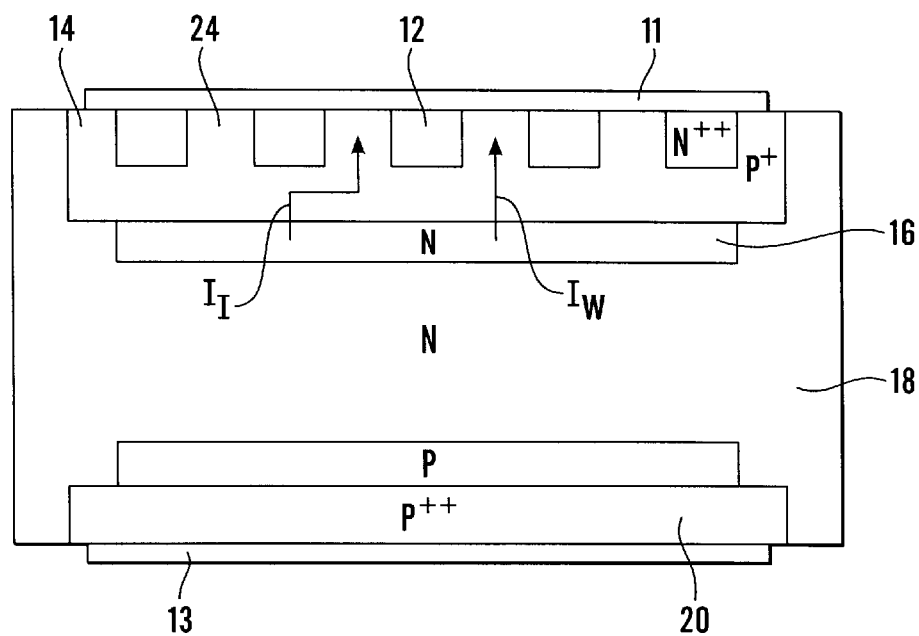
FIG. 1 shows in diagrammatic form one example of a conventional four layer (PNPN) diode.

FIG. 1 is one example of a conventional four layer (PNPN) diode 10 which has a cathode region 12 of highly doped N-type conductivity in a base region 14 of less highly doped but still heavily doped P-type conductivity. A heavily doped buried region 16, referred to as a blanket pad, of N-type conductivity is formed beneath the base region 14 at the junction of the base region 14 and a lightly doped region 18 of N-type conductivity which forms the bulk of the semiconductor device.

An anode region 20 of heavily doped P-type conductivity is located on the underside of the region 18.

The cathode region 12 is penetrated by a number of small area shorting dots 24 of the material of the base region 14. These are distributed over the area of the junction between the cathode region 12 and the base region 14 to provide a resistor connection across that junction and give the device a relatively high but controlled holding current. Metallisations 11, 13 are formed on the upper and lower surfaces of the device.

Figure 2:
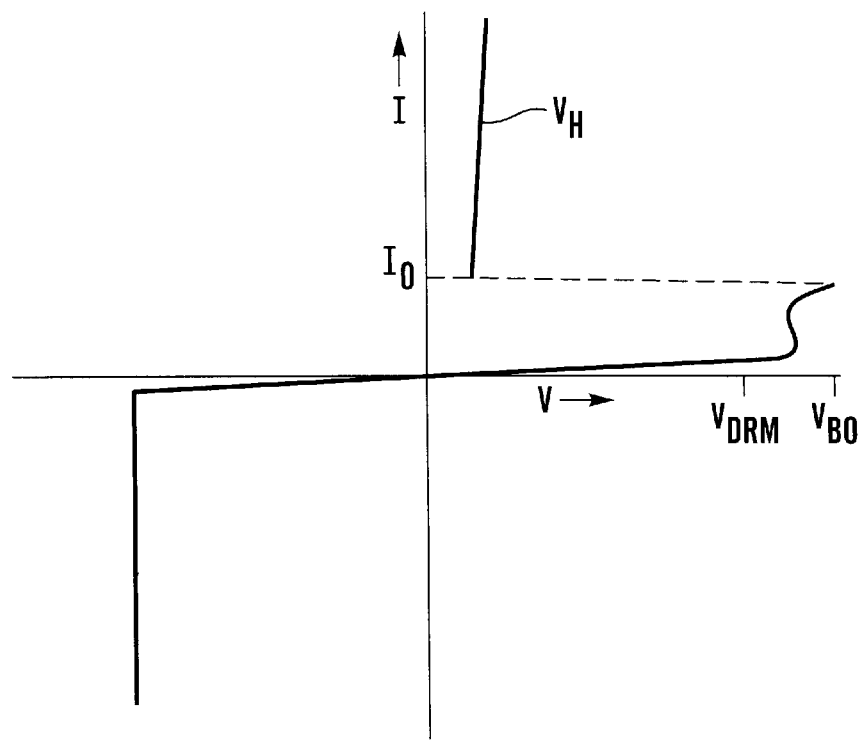
FIG. 2 shows the voltage-current characteristics of the device of FIG. 1.

FIG. 2 shows the voltage-current characteristics of the device of FIG. 1 in which, at a breakover voltage $V_{BO}$ the device switches from a blocking state to a conducting state with a holding voltage $V_H$. It can be seen from FIG. 2 that at the $V_{DRM}$ voltage the current begins to increase towards the breakover current $I_O$ as the breakover voltage approaches $V_{BO}$.

The blanket pad region 16 of the device of FIG. 1 controls the breakover voltage $V_{BO}$ of the device but does not affect the ratio of $V_{BO}$ to $V_{DRM}$. "Indirect" current $I_I$ flows indirectly from the region 16 into and laterally along the region 14 before flowing through the shorting dots 24. This lateral current generates a voltage drop beneath the cathode which acts to forward bias the base-cathode (14, 12) junction and eventually initiates switching. "Waste" current $I_W$, however, passes vertically through region 14 via the shorting dot without contributing significantly to turn on. The current density through the base-blanket pad (14, 16) junction is therefore higher than it would be if the only current flowing through the junction were the current $I_I$ which causes the device to switch. Hence the ratio of $V_{BO}$ to $V_{DRM}$ is also higher.

Figure 3:
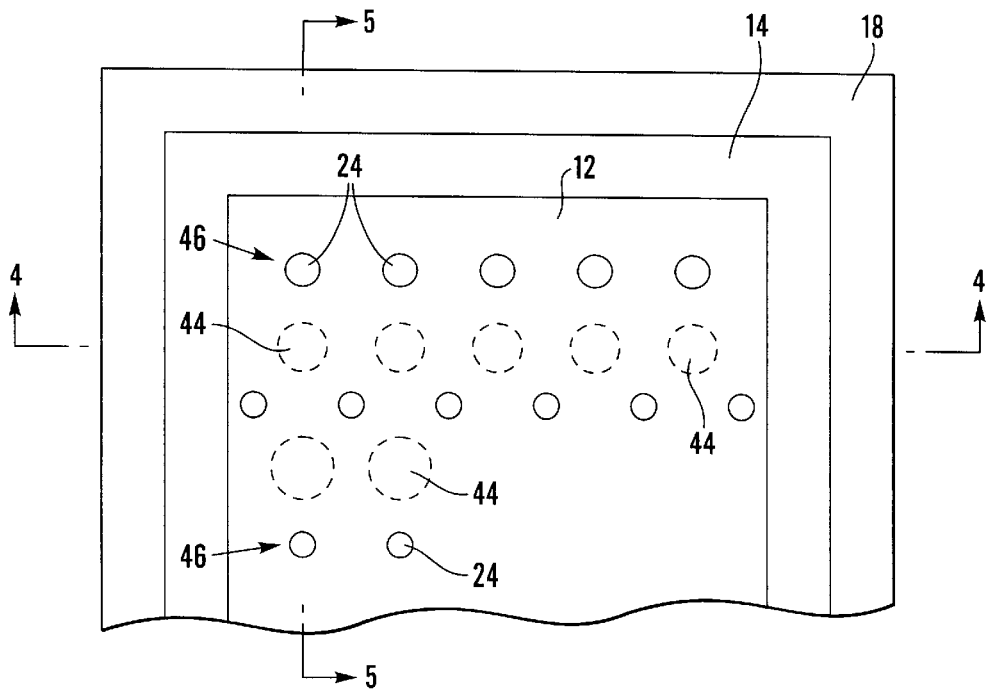
FIG. 3 shows in diagrammatic form a plan view of a portion of one embodiment of a semiconductor overvoltage protection device according to the present invention.
Figure 4:
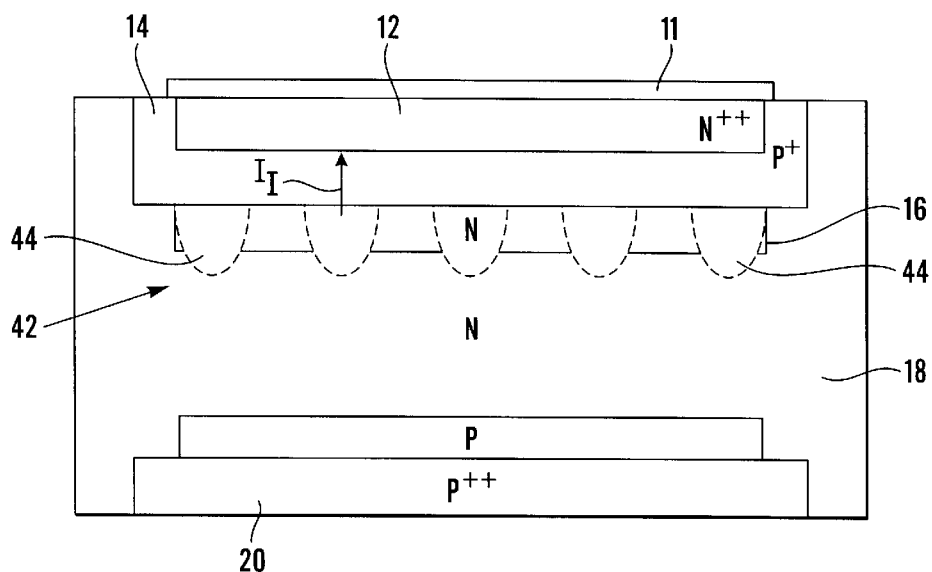
FIG. 4 is a section on the line 4—4 of the device of FIG. 3.
Figure 5:
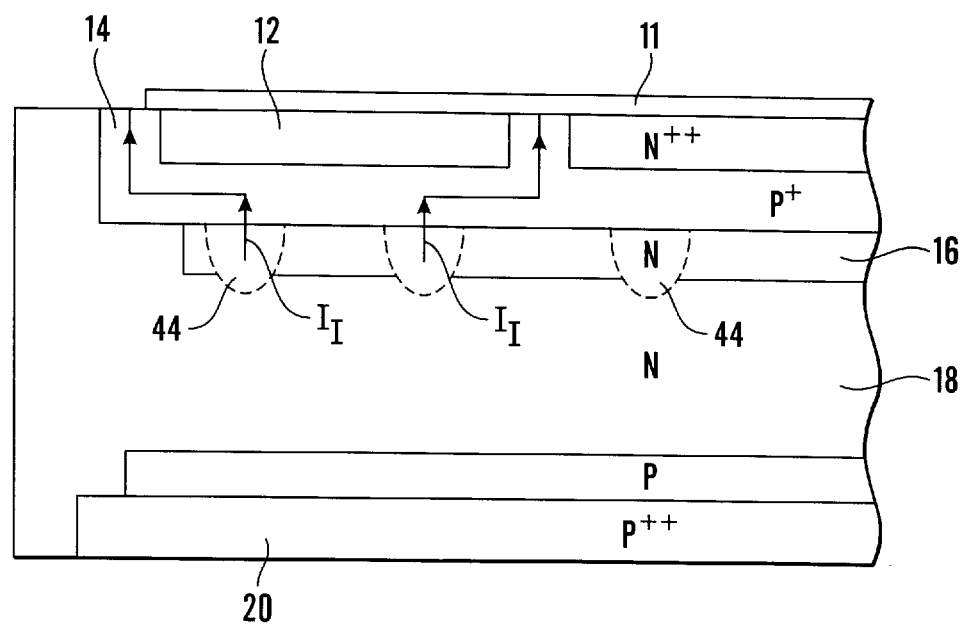
FIG. 5 is a section on the line 5—5 of the device of FIG. 3.

Referring now to FIGS. 3, 4 and 5 these shows a preferred embodiment of semiconductor overvoltage protection device according to the present invention which is in the form of a four layer (PNPN) diode 40. This is a modification to the structure of FIG. 1 and like parts are given like reference numbers. The metallisation 11 is omitted in FIG. 3 for clarity.

As can be seen from FIGS. 3, 4 and 5 a second heavily doped buried region 42 of the same conductivity type as the blanket pad region 16 is also formed beneath the base region 14 at the junction of the base region 14 and the blanket pad region 16. The second buried region 42 is in the form of a plurality of separate, small regions 44. Each sub region 44 extends through and beyond the first buried region 16 into the remaining portion of the region 18 forming the bulk of the device. It will be appreciated, however, that the sub regions 44 may terminate within the region 16. One or more of the sub regions 44 may terminate within the region 16 and one or more may extend through the region 16.

The sub regions 44 are patterned geometrically beneath the region 14 such that each sub region 44 has an impurity concentration which peaks at a point which is furthest displaced from the shorting dot centres. FIG. 3 is a plan view of the device with the sub regions 44 shown in dotted lines in relation to the shorting dots 24. In the particular arrangement shown in FIG. 3 the shorting dots 24 are arranged in rows 46 with adjacent rows being offset such that the shorting dots form triangular arrangements, although it will be appreciated that other arrangements could be used. In this particular case, each sub region 44 is positioned within a triangle of shorting dots 24, preferably equidistant from the shorting dots.

The ratio of impurity concentrations in the blanket pad region 16 and the sub regions 44 is arranged to provide corresponding breakdown voltages within a few percent (typically 5% or less) of each other with the sub regions 44 having the lower breakdown voltage. Typically, the concentration of impurities in the sub regions 44 is $10^{15}$ atoms per cm$^3$. To avoid preferential areas of conduction during switch-on it is desirable to have a uniform doping within the breakdown region. The presence of the blanket pad region 16 reduces to a minimum the perturbations caused by the more highly doped region 44.

One example of the device shown in FIG. 3 would have the following doping concentrations:

| Region | Doping material | Peak doping concentration |
| --- | --- | --- |
| Cathode region 12 | Phosphorus | $10^{20}$ |
| Shorting dots 24 | Boron | $5 \times 10^{17}$ |
| Anode region 20 | Boron | $10^{19}$ |
| Blanket pad and sub regions 16, 44 | Phosphorus | $10^{15}$ |

Whilst the sub regions 44 are shown in plan view in FIG. 4 as being circular, they may be of differing shapes.

The effect of the arrangement of sub regions 44 in FIG. 3 is to reduce the "waste" current $I_W$ which does not contribute significantly to the turn on current level. As a result, the level of turn on current $I_I$ is increased. Since more of the total current contributes to the turn on current, the characteristic curve of the device between $V_{DRM}$ and $V_{BO}$ increases more sharply, thus reducing the voltage gap between $V_{DRM}$ and $V_{BO}$ and bringing the ratio of $V_{BO}$ to $V_{DRM}$ closer to unity.

Figure 6:
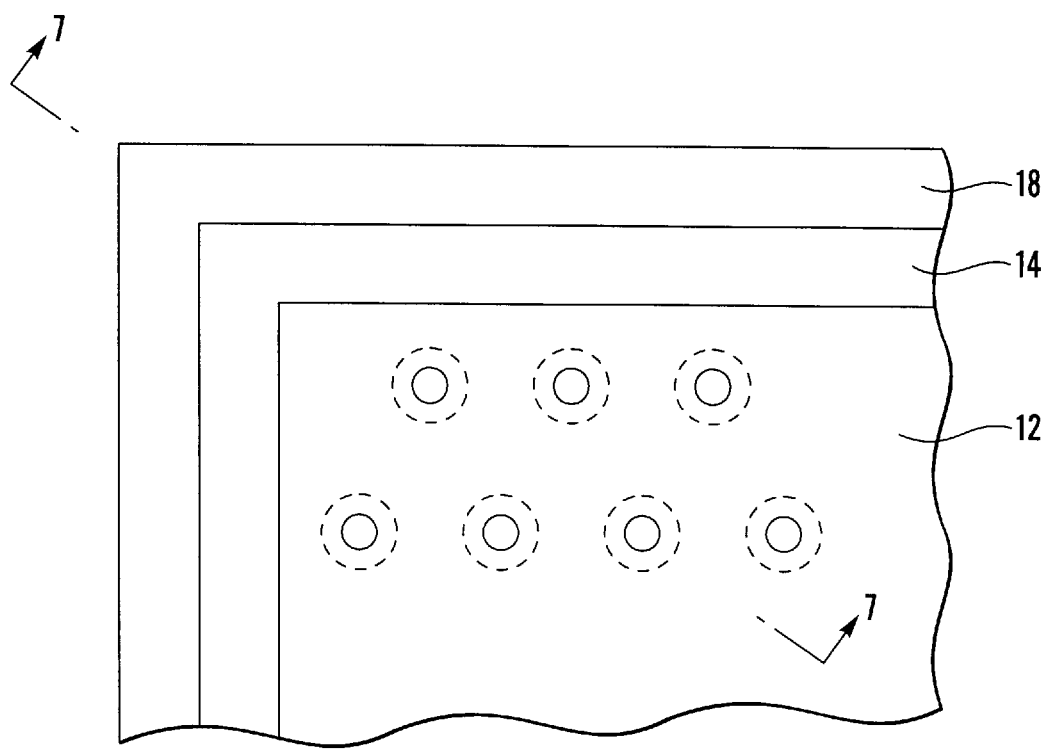
FIG. 6 shows in diagrammatic form a plan view of a portion of a second embodiment of a semiconductor overvoltage protection device according to the present invention.
Figure 7:
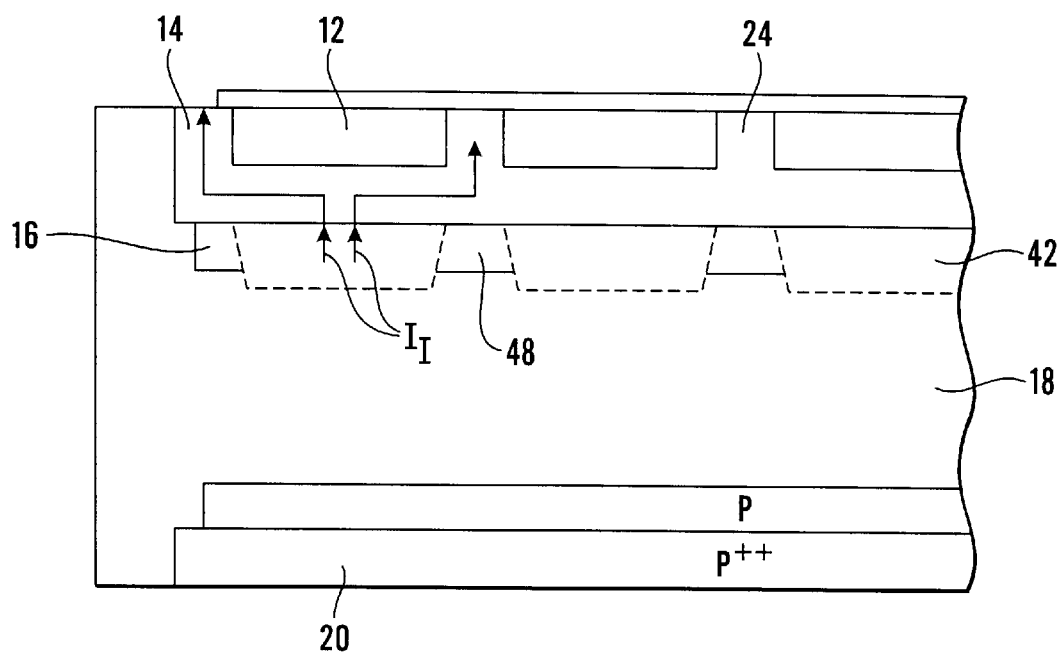
FIG. 7 is a section on the line 5—5 of the device of FIG. 6.

FIGS. 6 and 7 show a further embodiment of a semiconductor overvoltage protection device according to the present invention. The metallisation 11 is omitted in FIG. 6 for clarity. In the device of FIGS. 6 and 7 the second region is in the form of a single, continuous region 42 with a respective "hole" 48 aligned with each shorting dot 24. The holes are in effect regions which have the same doping concentration as the blanket pad region 16. It will be appreciated, of course, that the region 42 need not be a single continuous region but may be a suitable form intermediate those of FIGS. 3 and 6 and may be formed of several discrete regions with holes 48 aligned with the shorting dots 24. The breakdown current $I_I$ occurs in areas 50 of the second buried region 42, between the regions 48 as shown in FIG. 6.

The holes 48 are shown in FIG. 6 as being generally cylindrical and of larger diameter than the shorting dots 24 but it will also be appreciated that the holes 48 may be of any suitable shape and one or more may have a diameter or lateral dimension which is the same as or greater than a lateral dimension, such as the diameter, of the shorting dots 24.

What is claimed is:

1. A semiconductor overvoltage protection device in the form of a four layer diode having:

first and third layers of a first conductivity semiconductor material;

second and fourth layers of a second conductivity type semiconductor material;

a first buried region of the first conductivity type in the third layer adjacent to the junction between the second and third layers, the buried region having a greater impurity concentration than the third layer;

and a second buried region of the same conductivity type as and of higher impurity concentration than said first buried region in said first buried region adjacent to said junction; wherein:

said first layer is penetrated by a plurality of dots of said second layer extending through said first layer;

one of said first and second buried regions is formed with a plurality of separate regions of small area arranged so that reverse breakdown of the junction preferentially occurs through said second buried region;

and said dots do not overlie portions of said second buried region.

2. A semiconductor device according to claim 1 wherein said second buried region is formed with said plurality of separate regions, said regions being laterally offset from said dots.

3. A semiconductor device according to claim 1 wherein said first buried region is formed with said plurality of separate regions.

4. A semiconductor device according to claim 3 wherein each said dot vertically overlies a respective region of said first buried region.

5. A semiconductor device according to claim 1 wherein said second buried region terminates within said first buried region.

6. A semiconductor device according to claim 1 wherein said second buried region extends into said first region.

7. A semiconductor device according to claim 1 wherein the ratio of impurity concentration in said first and second buried regions is such that the breakdown voltage between said second layer and said first buried region exceeds the breakdown voltage between said second layer and said second buried region by no more than 5%.

8. A semiconductor device according to claim 1 wherein one or more of said separate regions has a lateral dimension greater than that of the associated dot.

9. A semiconductor device according to claim 1 wherein one or more of said separate regions has a lateral dimension the same as that of the associated dot.

10. A semiconductor overvoltage protection device in the form of a four layer diode having:

first and third layers of a first conductivity semiconductor material;

second and fourth layers of a second conductivity type semiconductor material;

a first buried region of the first conductivity type in the third layer adjacent to the junction between the second and third layers, the buried region having a greater impurity concentration than the third layer;

and a second buried region of the same conductivity type as and of higher impurity concentration than said first buried region in said first buried region adjacent to said junction; wherein:

said first layer is penetrated by a plurality of dots of said second layer extending through said first layer;

said second buried region is formed with a plurality of separate regions of small area arranged so that reverse breakdown of the junction preferentially occurs through said second buried region, said regions being laterally offset from said dots and one or more of said separate regions having a lateral dimension greater than that of the associated dot;

said dots do not overlie portions of said second buried region;

And the ratio of impurity concentration in said first and second buried regions is such that the breakdown voltage between said second layer and said first buried region exceeds the breakdown voltage between said second layer and said second buried region by no more than 5%.

11. A semiconductor overvoltage protection device in the form of a four layer diode having:

first and third layers of a first conductivity semiconductor material;

second and fourth layers of a second conductivity type semiconductor material;

a first buried region of the first conductivity type in the third layer adjacent to the junction between the second and third layers, the buried region having a greater impurity concentration than the third layer;

and a second buried region of the same conductivity type as and of higher impurity concentration than said first buried region in said first buried region adjacent to said junction; wherein:

said first layer is penetrated by a plurality of dots of said second layer extending through said first layer;

said first buried region is formed with a plurality of separate regions of small area arranged so that reverse breakdown of the junction preferentially occurs through said second buried region;

each said dot vertically overlies a respective region of said first buried region;

said dots do not overlie portions of said second buried region;

the ratio of impurity concentration in said first and second buried regions is such that the breakdown voltage between said second layer and said first buried region exceeds the breakdown voltage between said second layer and said second buried region by no more than 5%;

and one or more of said separate regions has a lateral dimension greater than that of the associated dot.

* * * * *